United States Patent [19]

Higgins et al.

[11] Patent Number: 5,623,233

[45] Date of Patent: Apr. 22, 1997

[54] PULSED OPTICALLY INJECTION LOCKED MESFET OSCILLATOR

[75] Inventors: Thomas P. Higgins; Dana J. Sturzebecher, both of Tinton Falls; Vladimir G. Gelnovatch, Manasquan, all of N.J.

[73] Assignee: The United States of America as represented by the Secretary of the Army, Washington, D.C.

[21] Appl. No.: 444,470

[22] Filed: May 19, 1995

Related U.S. Application Data

[63] Continuation-in-part of Ser. No. 153,594, Nov. 10, 1993, abandoned.

[51] Int. Cl.[6] .................................................... H03B 17/00
[52] U.S. Cl. .............................. 331/37; 331/55; 331/66; 331/117 FE; 331/173; 359/191; 332/113
[58] Field of Search .............................. 331/37, 66, 55, 331/172, 117 FE, 173; 359/161, 191; 455/330, 333; 332/113

[56] References Cited

U.S. PATENT DOCUMENTS

| | | | |
|---|---|---|---|
| 4,503,403 | 3/1985 | Taylor et al. | 331/37 |
| 4,859,965 | 8/1989 | Paolella et al. | 330/285 |
| 5,073,718 | 12/1991 | Paolella | 250/551 |
| 5,144,261 | 9/1992 | Harvey et al. | 331/66 |
| 5,162,657 | 11/1992 | Sturzebecher et al. | 250/551 |
| 5,373,261 | 12/1994 | Higgins et al. | 331/66 |

OTHER PUBLICATIONS

"Novel Optical Control Techniques for Solid–State Radar Transmitters" by Richard A. Kiehl, I.E.E.E. Trans. on Microwave Theory & Techniques, vol. MTT–28, No. 4; Apr. 1980.

Buck, D.C., and M.A. Cross, "Optical Injection Locking of FET Oscillators Using Fiber Optics", IEEE MITT Symposium, Digest of Papers, 1986.

Seeds, A.J., and A.A. DeSalles, "Optical Control of Microwave Semiconductor Devices", IEEE Transactions on Microwave Theory and Technique, vol. 38, No. 5, May 1990.

*Primary Examiner*—Robert Pascal
*Assistant Examiner*—Arnold Kinkead
*Attorney, Agent, or Firm*—Michael Zelenka; William H. Anderson

[57] ABSTRACT

An optically controlled MESFET semiconductor oscillator assembly having a MESFET semiconductor which, when voltage biased by a pulsed dc voltage, oscillates at a free running frequency; an optical signal delivery system, such as a light intensity modulator connected to optical fibers; and other oscillator circuitry including a pulse generator. In operation, the pulsed free running oscillation of the MESFET semiconductor can be injection locked to the intensity modulated optical signal delivered via the optical signal delivery system.

3 Claims, 2 Drawing Sheets

PULSED OPTICALLY INJECTION LOCKED MESFET OSCILLATOR

GOVERNMENT INTEREST

The invention described herein may be manufactured, used, sold and licensed by or for the Government of the United States without the payment to us of any royalties thereon.

CONTINUATION IN PART

The present application is a Continuation in Part of U.S. application Ser. No. 08/153,594, filed Nov. 10, 1993, now abandoned. Priority of this previously filed application is claimed.

FIELD OF THE INVENTION

The invention described herein relates to optically controlled oscillators, and more particularly to optically controlled injection locked oscillators which utilize MESFET semiconductors.

BACKGROUND OF THE INVENTION

A prior art optical control is described in U.S. Pat. No. 4,859,965, issued Aug. 22, 1989. The prior art optical control includes a light source for emitting light at a selective wavelength, control means coupled to said light source for controlling the intensity of the light emitted from said source, a fixed resistance, a GaAs multi-finger FET having parallel connected sources and parallel connected drains and parallel connected gate fingers, circuit means for connecting the sources and drains of said FET in series circuit with said fixed resistance across a source of positive dc voltage, optic fiber means optically coupled from said light source on the surface of said FET between the sources and drains of the FET and covering substantially all of the gate fingers of the FET, gate biasing means coupled to the gates of said FET for biasing said FET to a point near pinch-off to maximize the light sensitivity of the FET, an output lead coupled to a circuit junction of said fixed resistance and said FET, whereby changes in the intensity of light from said light source change the voltage drop across said FET and change the output from the output conductor.

Related prior art publications include:
1. Buck, D. C., and M. A. Cross, "Optical Injection Locking of FET Oscillators Using Fiber Optics", IEEE MTTSymposium, Digest of Papers, 1986.
2. Seeds, A. J., and A. A. De Salles, "Optical Control of Microwave Semiconductor Devices," IEEE Transactions on Microwave Theory and Techniques, Vol. 38, no. 5, May 1990.
3. U.S. Pat. No. 5,073,718, issued to Paollela on Dec. 17, 1991, and entitled, "Optical Control of a Microwave Switch".
4. U.S. Pat. No. 5,162,657 issued to Sturzebecher et al on Nov. 10, 1992 and entitled, "Optical Control of a Microwave Variable Attenuator."
5. U.S. Pat. No. 5,144,261 issued to Harvey et al on Sep. 1, 1992 and entitled, "Optically Injection Locked Resonant Tunnel Diode Oscillator".
6. U.S. Pat. No. 5,373,261 issued to Higgins et al on Dec. 13, 1994 and entitled, "An Improved Direct Optical Injection Locked FET Oscillator."

The references show that the technology of microwave light generation and delivery using lasers, light emitting diodes, plasma tubes and the like in combination with intensity modulators and fiber optics is well known. Therefore, as is suggested by the above identified references, one skilled in the art would readily be able to design any number of optical or integrated optic systems to deliver light intensity modulated at microwave or millimeter wave frequencies to the semiconductive device and incorporate such a semiconductive device in oscillator circuit applications.

An example of important technical fields where such semiconductor devices would be able to be directly incorporated in phased array radar and communication systems and in remote antenna systems. As suggested by the above references, intensity modulated light would modulate active oscillator modules using these semiconductor devices and can be distributed over an antenna array remote from the rest of the radar or communication system. One means of achieving modulation, is by modulating oscillators with a direct optical signal delivered over optical fibers. Various means are available to optically control semiconductor devices, including the direct optical modulation of oscillators utilizing IMPATT and Gunn diodes. However, these semiconductor devices are difficult to integrate into MMIC systems, and lack some of the enhanced performance characteristics of a MESFET field effect transistor and, therefore, integration and locking of oscillator modules in MMIC (microwave monolithic integrated circuit) systems would be further optimized by optically controlling MESFETS incorporated in such oscillators.

The present invention addresses this present need for direct optical control of a MESFET to modulate or lock a MESFET oscillator.

SUMMARY OF THE INVENTION

One object of the invention is to lock the natural frequency of a MESFET oscillator with minimum noise using an externally modulated optical signal.

Another object of the invention is to provide this control using an external signal which can be easily transmitted, over a media which is not influenced by other electrical signals and which is light weight and inexpensive.

In accordance with these objectives, the present invention provides an oscillator based on a MESFET structure whose natural oscillating frequency is frequency locked by an external intensity modulated optical signal.

In the most generic embodiment of the present invention, the optically controlled, injection locked oscillator comprises a MESFET which, when voltage biased, oscillates at a free running frequency; an optical signal delivery system, such as a light intensity modulator connected to optical fibers; and other supplementary oscillator circuitry. In operation, the free running oscillation of the MESFET can be injection locked to the frequency of the intensity modulated optical signal delivered via the optical signal delivery system. This injection locking occurs as the modulation frequency approaches the free running oscillation frequency. Experiments conducted by the inventors herein, and test data obtained show the improved performance of the oscillator utilizing the MESFET.

BRIEF DESCRIPTION OF THE DRAWINGS

These and other objects, features and details of the present invention will become apparent in light of the ensuing detailed disclosure, and particularly in light of the drawings wherein.

DESCRIPTION OF THE PREFERRED EMBODIMENT

Figure 1:
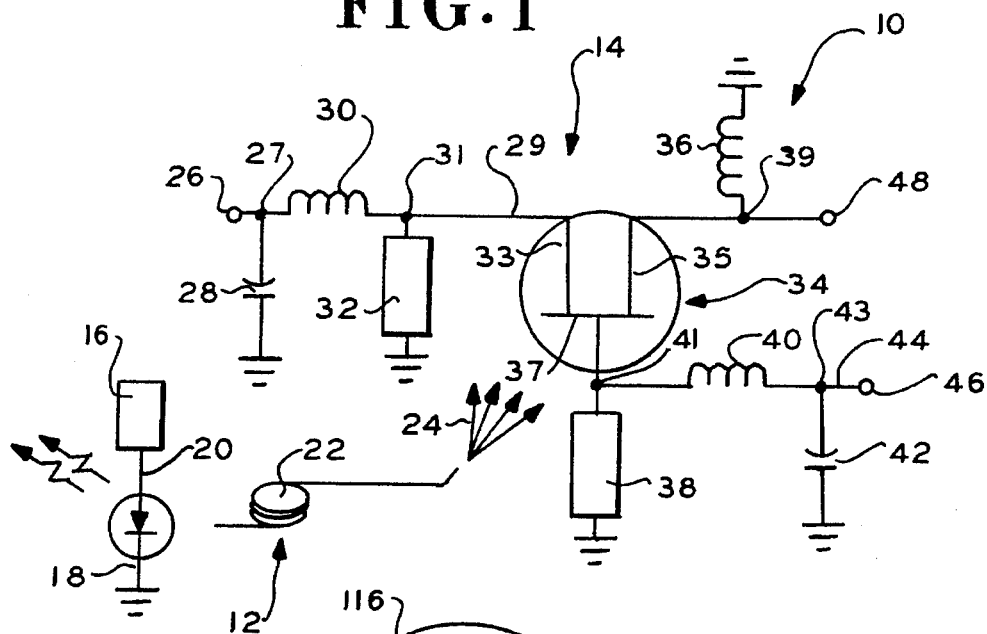
FIG. 1 is a schematic circuit diagram of a pulsed, optically injection locked MESFET oscillator assembly according to the present invention.

As shown in FIG. 1, a circuit or assembly 10 is provided. Assembly 10 includes an input light emitter subassembly 12 and an oscillator subassembly 14. As shown in FIG. 1 emitter subassembly 12 has a modulated laser or high speed laser diode 18 and an optical fiber or fiber optic link 22 which projects light or optical signal 24. A MESFET or transistor 34 has an interface with an opening for optical signal 24 from the optical fiber 22. Diode 18 is connected in series circuit with an RF drive 16 by means of a lead 20. RF drive 16 includes an RF matching and DC bias circuit.

As shown in FIG. 1, oscillator subassembly 14 receives modulated light from, emitter subassembly 12. Incorporated in oscillator subassembly 14 is a MESFET 34, which has a parallel finger source 33 and parallel finger drain 35 and parallel finger gate 37. The source and drain electrodes 33 and 35 must be separated by a space large enough so that when an optical signal, which is matched to the free-running frequency of the MESFET 34, is coupled to the space between the source and drain electrodes, the MESFET has an injection locking bandwidth which is at least twice as large as a chirp bandwidth of the MESFET 34. The source 33 and drain 35 are connected in series circuit with a first circuit junction 27 and a resistance 30 and a second circuit junction 31 and a third circuit junction 39 and a resistance or choke 36, across a source of dc bias voltage 26 by means of a lead 29. First circuit junction 27 connects to a capacitor 28. Capacitor 28 and resistor 30 act as a dc bias filter. Second circuit junction 31 connects to a capacitive impedance 32, which is a negative reactance and which is presented to source 33. Third circuit junction 39 connects to a pulsed microwave output 48 for a 50 ohm transmission line. The gate 37 is connected in series circuit by lead 44 to a fourth circuit junction 41 and a resistance 40 and a fifth circuit junction 43 to a gate bias voltage source 46 for dc or pulsed dc voltage. Fourth circuit junction 41 is connected to an inductive impedance 38, which is a positive reactance and which is presented to gate 37. Fifth circuit junction 43 connects to a capacitor 42. Resistance 40 and capacitor 42 act as a dc bias filter. Voltage source 46 includes a pulse generator.

In operation, MESFET 34 is biased in the negative differential resistance (NDR) region. When so biased, MESFET 34 oscillates at a free-running frequency which is determined by the internal and external capacitances and the external inductance of the device. The free-running oscillation of MESFET 34 is then frequency modulated and injection locked by the intensity modulated optic signal 24 which is delivered via subassembly 12. Intensity modulation of the optical signal 24 results in injection locking of the MESFET oscillator.

Figure 2:
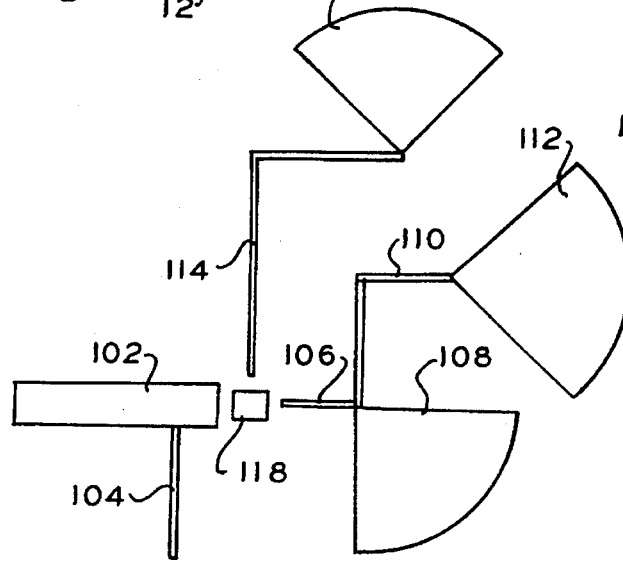
FIG. 2 is a layout of a microstrip oscillator assembly corresponding to the assembly of FIG. 1.

As shown in FIG. 2, a microstrip layout or arrangement 100 is also provided. Arrangement 100 has a microwave output 102, which is a 50 ohm transmission line and which corresponds to output 48; and has a one quarter wavelength high impedance shorted stub-choke 104 for dc grounding the drain 35 for bias purposes, but not for RF grounding, which corresponds to choke 36. Arrangement 100 also has an inductive impedance 106, which is presented to the gate terminal and which corresponds to impedance 38; and has a one quarter wavelength radial stub 108 for the purpose of RF grounding one end of impedance 106 without dc grounding it; and has a dc bias filter, made of a resistance 110 and capacitance 112, which correspond to resistance 40 and capacitance 42. Arrangement 100 also has a capacitive impedance 114, which is presented to the source 33 and which corresponds to impedance 32; and has a dc bias filter 116, which correspond to the filter made of resistance 30 and capacitance 28, and has a chip form MESFET 118, which is mounted to a substrate.

The oscillator prototype, which was tested, was designed using conventional techniques, with the MESFET in the common gate configuration with series feedback and fabricated on an alumina substrate in hybrid form. An experiment was conducted to demonstrate the invention. When operating in the CW mode, the DC bias levels, applied at 26 & 46 through bias filters were: $V_{source}=-1.7$ V and $V_{gate}=-2.8$ V, and the drain was grounded through 36. The bonding pads on the chip-form MESFET 34 were wire bonded to their respective drain 33, source 35 and gate 34 circuits. The gate 37 circuit, appearing inductive 38 to the MESFET 34, and the source 33 circuit, appearing capacitive 32, present the required impedance to the MESFET in order oscillate at the design frequency. The RF power produced, is fed out the 50 ohm transmission line and into the test system. When the gate voltage is changed to −4.3 volts, the device 10 is pinched off, and the oscillation ceases. For pulsed RF operation, the gate DC supply was replaced with a pulse generator, in which the high and low output voltages could be set to the DC levels described above, and varied with time as shown in FIG. 3.

Figure 3:
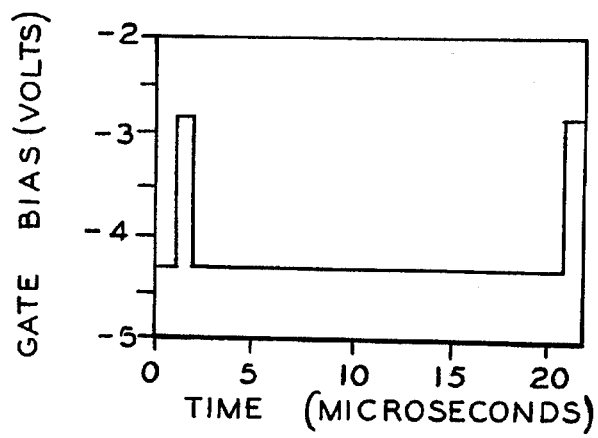
FIG. 3 is a graph of gate bias (volts) versus time (microseconds)

FIG. 3 shows the voltage used to pulse on the MESFET with a duty cycle of 5%, pulse width of 1.0 us, and a pulse repetition frequency (PRF) of 50 KHz. The rise time of the RF pulse was approximately 75 μs, however, this was a limitation of the oscillator circuit itself, and not of the optics, or the optical/microwave interface.

Figure 4:
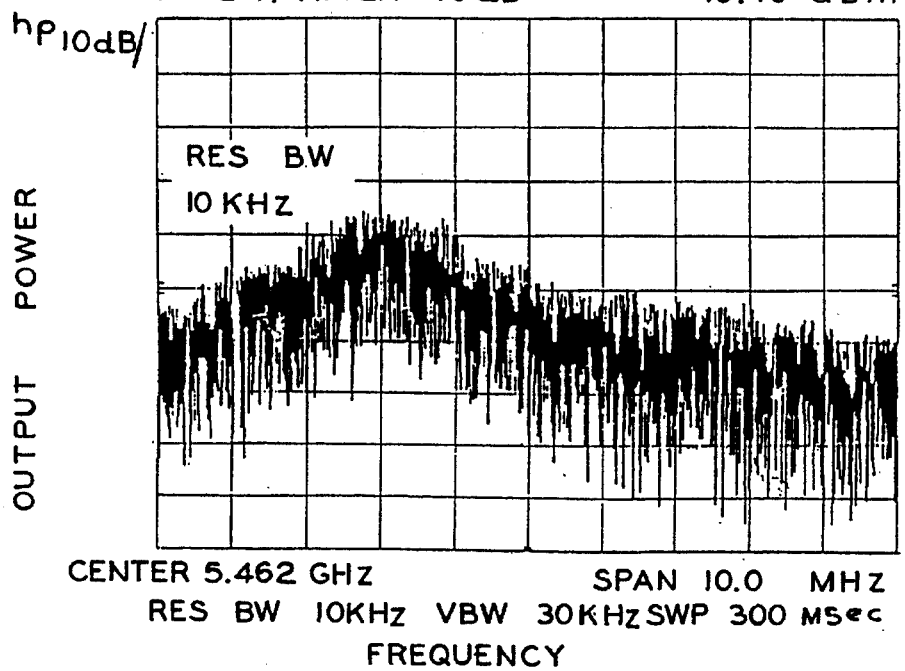
FIG. 4 is a graph of output power versus frequency of the assembly of FIG. 1, while free running.

FIG. 4 shows the free running oscillator with the above mentioned pulse. The laser diode 18, operating at a wavelength of 0.85 um, coupled to a multimode optical fiber 22, was modulated with a microwave signal 24 close to that of the free running oscillator. The open end of the optical fiber 22 is placed into direct contact with the MESFET 34, so that the maximum possible output light signal is absorbed in the active-region of the MESFET for injection locking of oscillator 10.

Figure 5:
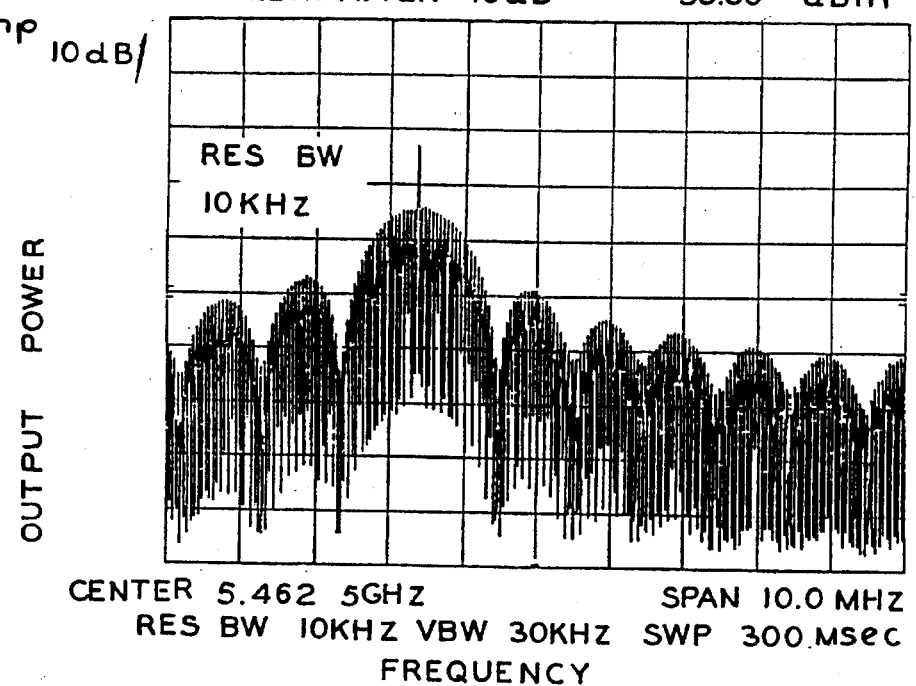
FIG. 5 is a graph of output power versus frequency of the assembly of FIG. 1, while injection locked.

FIG. 5, shows the directly optically injection locked pulsed RF spectrum, where approximately 4.0 mW of optical power and an optical modulation depth (OMD) of 100% was used. The peak RF output power out of the oscillator in the experiment was 10 mill. Since the optical injection locking bandwidth of the CW free running oscillator was approximately 30 MHz, and the chirp bandwidth in the pulse mode was significantly less than 30 MHz, the oscillator was easily injection locked in the pulsed mode. "Chirp" is defined as the drift in output frequency an oscillator undergoes during the pulse, or on time, which can render an oscillator useless for many applications.

Advantages of the assembly 10 are indicated hereafter.

This invention has demonstrated a pulsed MESFET oscillator 10 that has been directly optically injection locked. The oscillator used in the experiments described here, exhibits a optical locking bandwidth which is larger than the "chirp" bandwidth, hence the ability to successfully injection lock it.

With the success of MMIC technology, there is a need for MMIC compatible components. Since conventional pulsed microwave sources, such as Gunn and IMPATT diodes are difficult to integrate into MMIC processing, MESFET 10 can be used as a pulsed oscillator on MMICS. MESFET 10 can also be used as an optical port on MMICS. The optical signal emitted from the optical fiber directly illuminates the active area of MESFET 10, which also acts as a high speed photo detector.

In the experiments described here, MESFET 10 was used as a pulsed microwave source and as an optical port, so that the MESFET oscillator could be optically synchronized via fiber optics, with a remote microwave source.

Using a single circuit element for more than one function has the obvious advantage of simplifying circuit design, and lowering the cost. Optical fiber 22 has advantages over conventional microwave transmission lines because it is thin, lightweight, low loss, and has high immunity to EMI & EMP.

The use of fiber optic link 22 to directly optically injection lock pulsed MESFET oscillator 10 is new.

The act of pulsing a microwave MESFET oscillator, by pulsing the bias voltage, leads to unacceptable frequency variations in the output RF signal. This invention corrects those variations, and allows one to remotely synchronize such an oscillator to an external source.

Assembly 10 can be used in various applications, including phase array radar, phased array communication systems, remote control of microwave and millimeter wave antennas, EMI/EMP hardening optical devices for low power signal processing, and optical isolation of microwave subsystems to reduce vulnerability to reflected microwave power and to permit separate shielding from EMI and EMP.

While the invention has been described in its preferred embodiment, it is to be understood that the words which have been used are words of description rather than words of limitation and that changes may be made within the purview of the appended claims without departing from the true scope and spirit of the invention in its broader aspects.

What is claimed is:

1. An injection locked pulsed oscillator in a microwave monolithic integrated circuit comprising:

an intensity modulated optical signal delivery system;

oscillator circuitry comprising means to provide a dc pulsed voltage, the oscillator circuitry being electrically integrated in the microwave monolithic integrated circuit; and a metal-semiconductor field effect transistor (MESFET) biased by the dc pulsed voltage via a gate electrode to a pulsed free-running frequency, the MESFET having source and drain electrodes which are separated by a space large enough such that when an optical signal, which is matched to the pulsed free-running frequency of the MESFET, is directed to the space between the source and the drain electrodes, the MESFET has an injection locking bandwidth which is at least twice as large as a chirp bandwidth of the MESFET.

2. The injection locked pulsed oscillator of claim 1, wherein the gate electrode of the MESFET semiconductor is a parallel finger gate which is connected to a gate dc supply having a pulse generator.

3. The injection locked pulsed oscillator of claim 2, wherein said light source is a laser diode.

* * * * *

UNITED STATES PATENT AND TRADEMARK OFFICE
CERTIFICATE OF CORRECTION

PATENT NO. : 5,623,233
DATED : Apr. 22, 1997
INVENTOR(S) : Thomas P. Higgins, Dana J. Sturzebecher, Vladimir G. Gelnovatch It is certified that error appears in the above-identified patent and that said Letters Patent is hereby corrected as shown below:

Column 4, line 44, delete "75 µs" and insert --75 ns--.

Signed and Sealed this

Twenty-third Day of December, 1997

Attest:

BRUCE LEHMAN

*Attesting Officer*    *Commissioner of Patents and Trademarks*